(12) United States Patent
Park (10) Patent No.: US 7,196,949 B2
(45) Date of Patent: Mar. 27, 2007

(54) SEMICONDUCTOR MEMORY DEVICE WITH REDUCED SKEW ON DATA LINE

(75) Inventor: Ki-Chon Park, Ichon-shi (KR)

(73) Assignee: Hynix Semiconductor, Inc., Ichon-shi (KR)

( * ) Notice: Subject to any disclaimer, the term of this patent is extended or adjusted under 35 U.S.C. 154(b) by 0 days.

(21) Appl. No.: 11/019,190

(22) Filed: Dec. 23, 2004

(65) Prior Publication Data
US 2005/0226061 A1  Oct. 13, 2005

(30) Foreign Application Priority Data
Mar. 30, 2004  (KR) .................. 10-2004-0021516

(51) Int. Cl.
*G11C 7/00* (2006.01)
(52) U.S. Cl. .................. 365/194; 365/189.05
(58) Field of Classification Search .............. 365/194
See application file for complete search history.

(56) References Cited

U.S. PATENT DOCUMENTS

| | | | |
|---|---|---|---|
| 5,467,313 A * | 11/1995 | Jung et al. ............. | 365/189.11 |
| 5,703,815 A * | 12/1997 | Kuhara et al. ............. | 365/194 |
| 5,724,287 A * | 3/1998 | Takenaka .................... | 365/191 |
| 5,917,761 A * | 6/1999 | Tietjen et al. ............... | 365/194 |
| 5,949,697 A | 9/1999 | Lee | |
| 6,166,973 A * | 12/2000 | Shinozaki .................... | 365/200 |
| 6,650,575 B1 * | 11/2003 | Khanna ....................... | 365/194 |
| 6,665,218 B2 * | 12/2003 | Meier et al. ............ | 365/189.12 |
| 2003/0086303 A1 * | 5/2003 | Jeong .................... | 365/189.05 |
| 2004/0210809 A1 | 10/2004 | Cho | |

FOREIGN PATENT DOCUMENTS

| | | |
|---|---|---|
| JP | 10-178158 | 6/1998 |
| JP | 11-144464 | 5/1999 |
| JP | 2004-005856 | 1/2004 |

* cited by examiner

*Primary Examiner*—Tan T. Nguyen
(74) *Attorney, Agent, or Firm*—Lowe Hauptman & Berner, LLP (57) ABSTRACT

A semiconductor memory device including: a plurality of read sense amplifiers for amplifying an output data of a memory cell; a plurality of read delay controllers for delaying an output data of the read sense amplifier by a predetermined time; a plurality of read latches for outputting an output data of the read delay controller as an external data in response to a read strobe signal; a plurality of write sense amplifiers for sensing and amplifying the external data in response to a write strobe signal; a plurality of write delay controllers for delaying an output data of the write sense amplifier by a predetermined time; a plurality of write drivers for inputting an output data of the write delay controller to the memory cell in response to a write enable signal; and a plurality of data buses for transferring the data.

16 Claims, 9 Drawing Sheets

SEMICONDUCTOR MEMORY DEVICE WITH REDUCED SKEW ON DATA LINE

FIELD OF INVENTION

The present invention relates to a semiconductor memory design technology; and, more particularly, to a semiconductor memory device capable of reducing a skew on data line.

DESCRIPTION OF PRIOR ART

Recently, as a semiconductor memory device tends to be highly integrated and operated at high speed, it is difficult to secure a setup/hold time in a circuit due to a signal skew.

Figure 1:
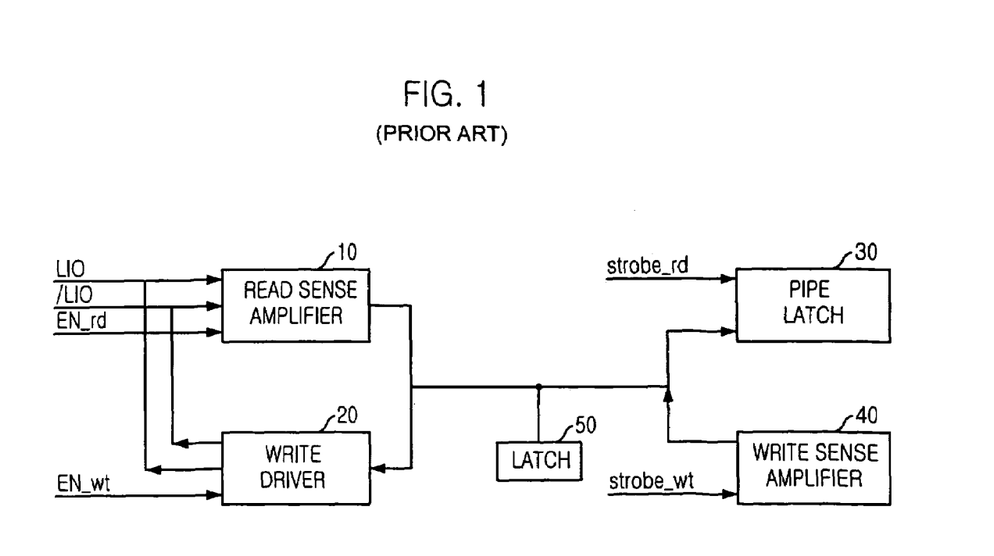
FIG. 1 is a block diagram of a conventional semiconductor memory device having data bus and devices connected thereto.

FIG. 1 is a block diagram of a conventional semiconductor memory device having data buses GIO and devices connected thereto.

Referring to FIG. 1, the conventional semiconductor memory device includes a read sense amplifier 10, a read latch (pipe latch) 30, a write sense amplifier 40, a plurality of write drivers 20, and data bus GIO.

The read sense amplifier 10 amplifies data outputted from memory cells, and the read latch 30 outputs an output data of the read sense amplifier 10 as an external data in response to a read strobe signal strobe_rd. The write sense amplifier 40 senses and amplifies the external data and outputs it in response to a write strobe signal strobe_wt. The write drivers 20 inputs an output data of the write sense amplifier 40 to the memory cells in response to a write enable signal EN_wt. The data is transferred through the data bus GIO. The data bus GIO is commonly connected between the read latch 30 and the read sense amplifier 10 and between the write sense amplifier 40 and the write driver 20.

Also, a latch 50 connected to the data bus GIO is further provided to temporarily store the transferring data.

An operation of the conventional semiconductor memory device will be described below.

In a read operation, data is outputted from the memory cell and the read sense amplifier 10 senses and amplifies the data in response to the read enable signal EN_rd. Then, the data is transferred through the data bus GIO and the read latch 30 latches the data in response to the read strobe signal strobe_rd and then outputs it as the external data.

In a write operation, the write sense amplifier 40 senses and amplifies the external data in response to the write strobe signal strobe_wt and the write driver 20 receives the amplified data from the write sense amplifier 40 through the data bus GIO. Then, the write driver 20 transfers the data to the memory cell in response to the write enable signal EN_wt.

Meanwhile, the semiconductor memory device includes a plurality of the above structure in proportion to the number of data bits. Specifically, a plurality of data buses GIO have different lengths due to a physical device characteristic, resulting in skew of data transferred through the data buses GIO. That is, in the read operation, the time point when the read strobe signal strobe_rd is activated is the problem, and in the write operation, the time point when the write strobe signal strobe_wt is the problem.

Next, the case where the length of the data bus GIO is changed due to the physical limit of the semiconductor memory device and the related problem thereof will be described with reference to the waveforms.

Figure 2A:
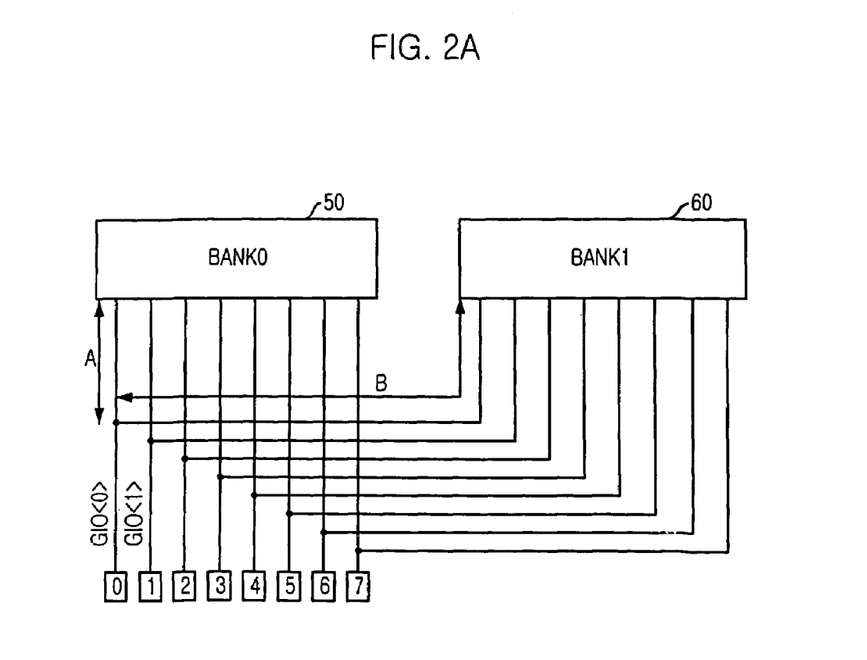
FIGS. 2A to 2C illustrate the cases where the length of the data buses is different according to the selection of the bank.

FIG. 2A illustrates the case where the length of the data buses GIO is changed according to the selection of the bank. On the basis of the GIO<0>, if the bank (BAND0) 50 is selected, the data bus GIO<0> has a length of "A". Meanwhile, if the bank (BANK1) 60 is selected, the data bus GIO<B> has a length of "B". That is, even the same data buses GIO have different lengths according to the selection of the banks.

Figure 2B:
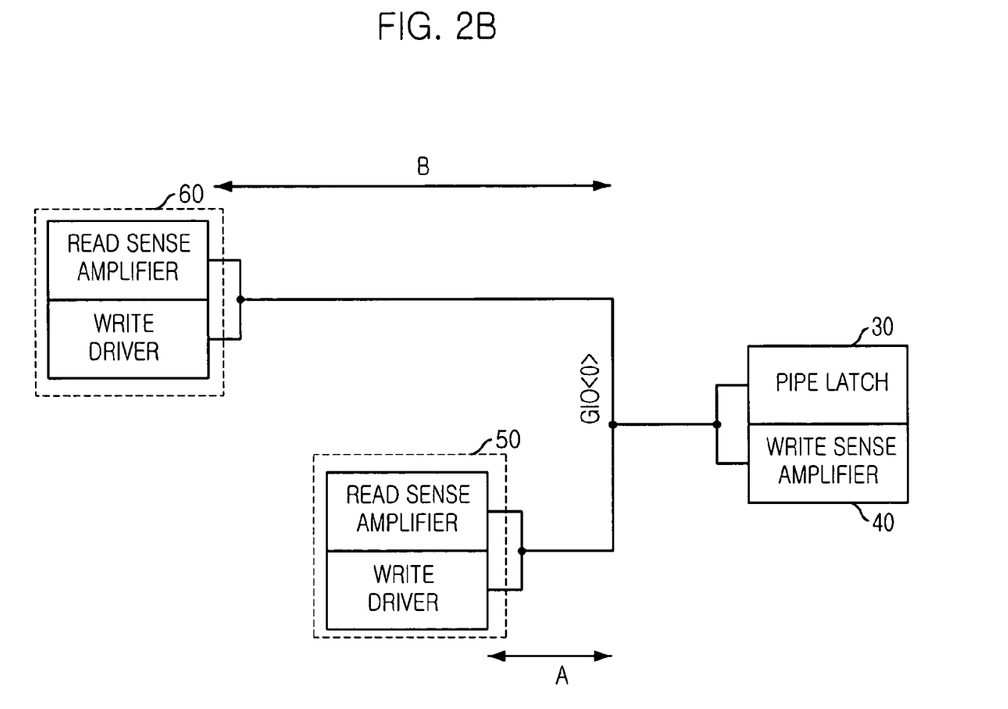

FIG. 2B is a detailed diagram of the data bus GIO<0> shown in FIG. 2A. It can be seen from FIG. 2B that even the same data buses GIO<0> have different lengths.

Figure 2C:
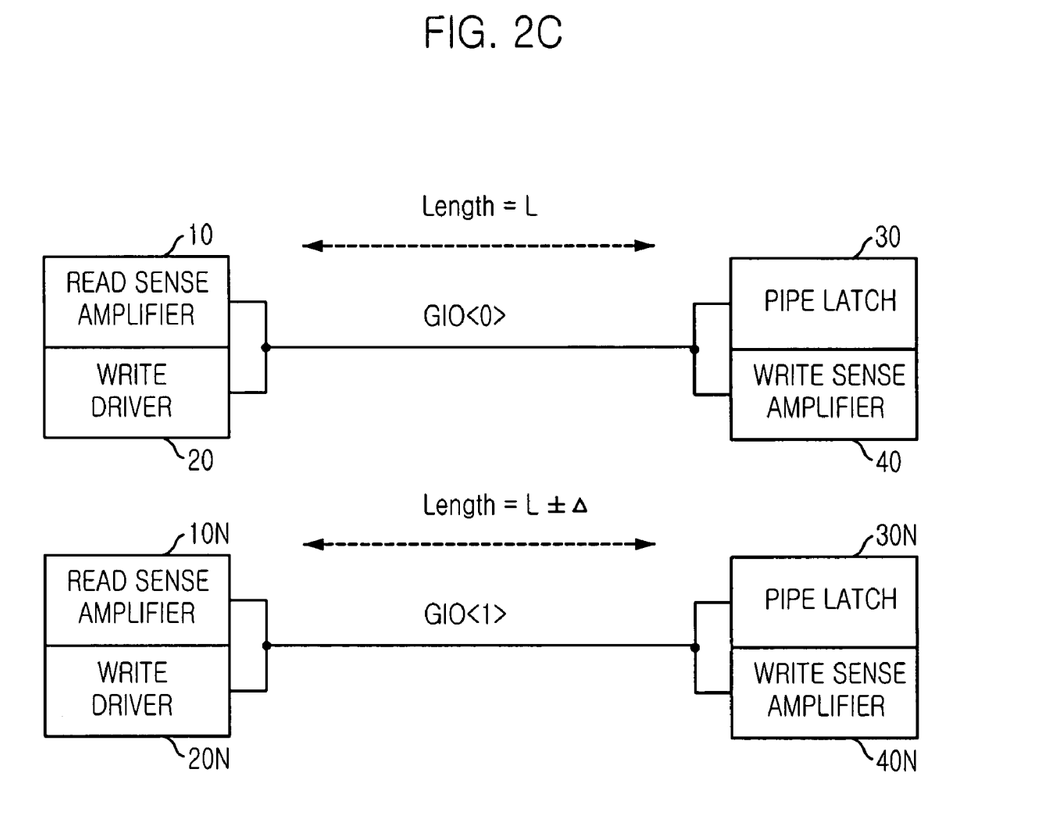

FIG. 2C illustrates the data buses GIO<0> and GIO<1> and devices connected thereto. The data buses GIO<0> and GIO<1> have different lengths.

Figure 3A:
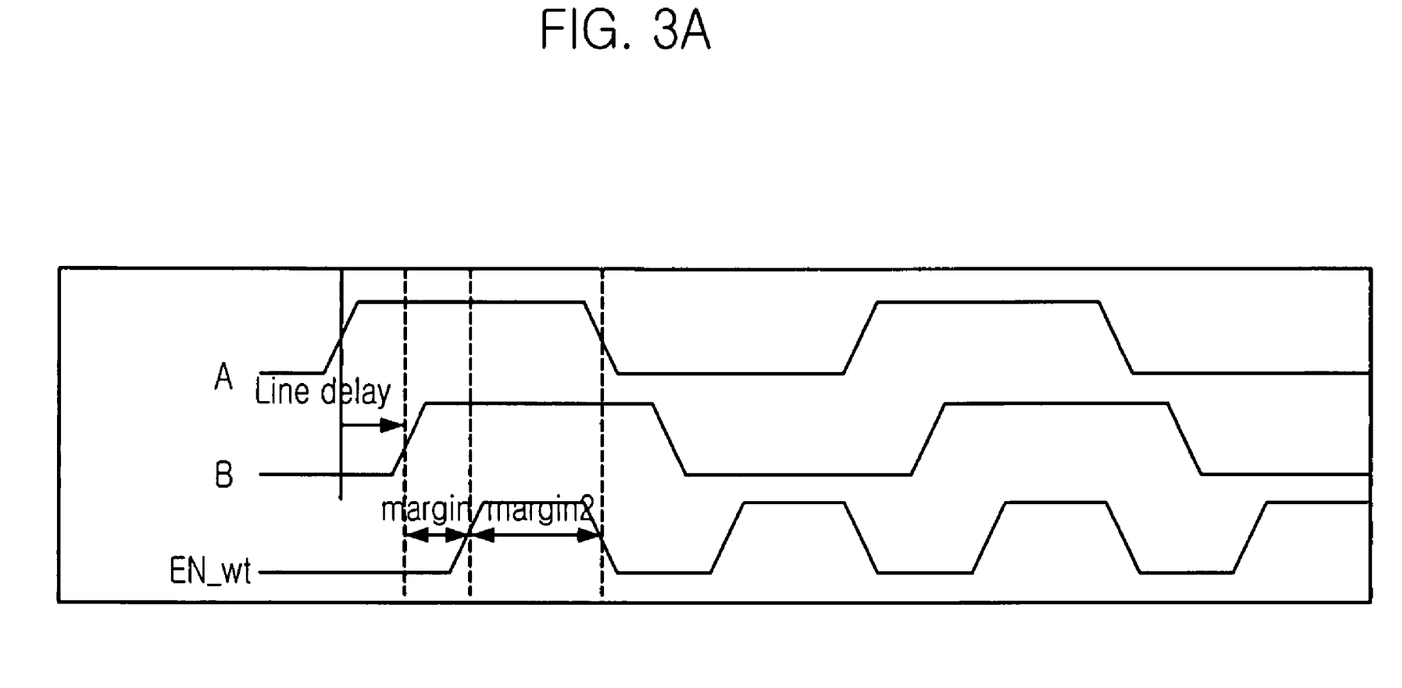
FIGS. 3A and 3B are operation waveforms of the semiconductor memory device shown in FIG. 2 according to different operating frequencies.

FIG. 3A is an operation waveform of the structure shown in FIG. 1 in the write operation, showing the time point when the data transferred through the data bus GIO arrive at the write driver and the time point when the write enable signal EN_wt is activated.

Referring to FIG. 3A, the external data inputted from the write sense amplifier 40 arrive at the write driver through the data buses GIO<0> and GIO<1>. However, the time points of the data arrival are different. Therefore, the write enable signal EN-wt is activated at a time point when the setup time is satisfied with respect to the slow signal B and is deactivated at a time point when a fast signal A is deactivated. Consequently, the setup time of the write enable signal EN_wt is restricted by the slowest signal and the hold time is restricted by the fastest signal.

The reason why the arrival time of the signals A and B is different is that the length of the data bus GIO from the write sense amplifier 40 to the corresponding write driver 20 is different, as shown in FIGS. 2A and 2B.

Figure 3B:
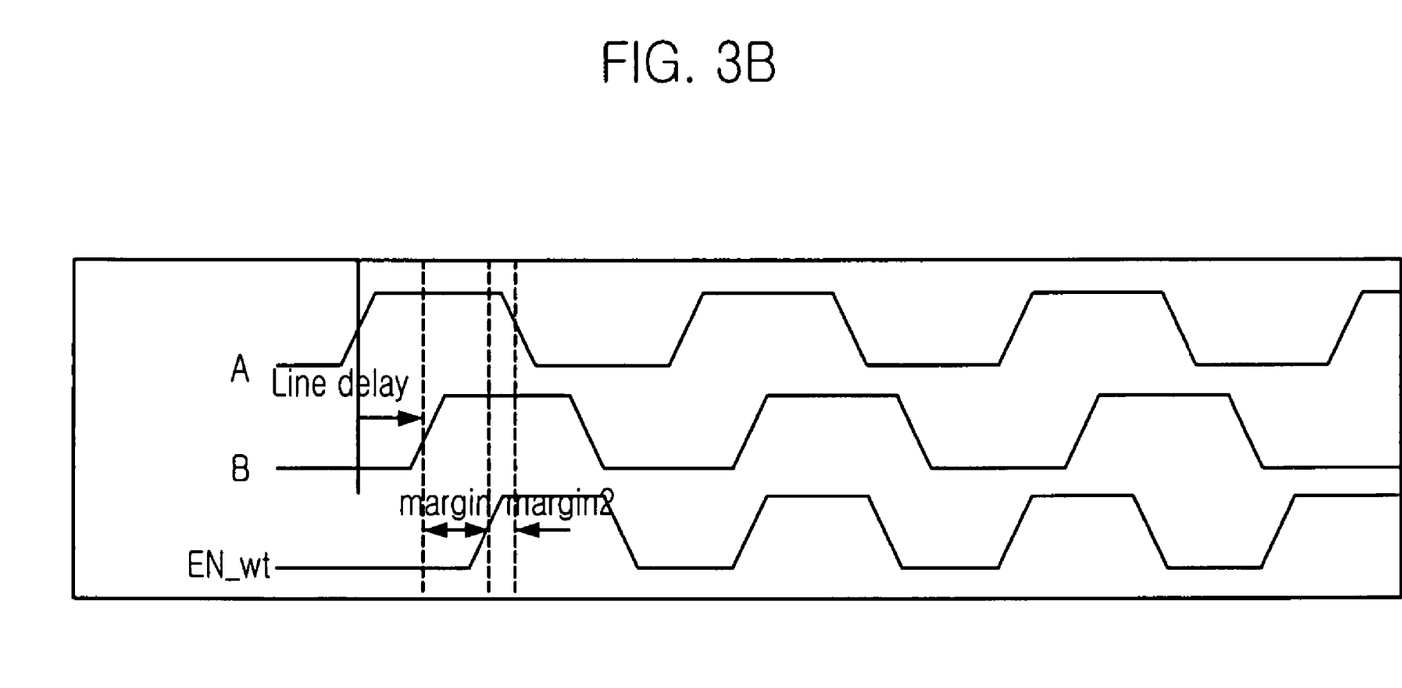

FIG. 3B is an operation waveform of the structure shown in FIG. 2, in which the operating frequency is higher than that of FIG. 3A. Since the operating frequency is high, the pulse widths of the signals A and B are narrow. Thus, it is difficult to secure the setup time and the hold time of the write enable signal EN_wt.

Accordingly, since the lengths of the data buses are different depending on the position of the selected bank, the skew occurs between the arriving data, thus making it difficult to secure a setup/hold time in the semiconductor memory device.

Although the skew problem in the write operation is exemplarily described, the same problem also occurs in the read operation.

SUMMARY OF INVENTION

It is, therefore, an object of the present invention to provide a semiconductor memory device capable of reducing a skew on data lines.

In accordance with an aspect of the present invention, there is provided a semiconductor memory device including: a plurality of read sense amplifiers for amplifying an output data of a memory cell; a plurality of read delay controllers for delaying an output data of the read sense amplifier by a predetermined time; a plurality of read latches for outputting an output data of the read delay controller as an external data in response to a read strobe signal; a plurality of write sense amplifiers for sensing and amplifying the external data in response to a write strobe signal; a plurality of write delay controllers for delaying an output data of the write sense amplifier by a predetermined time; a plurality of write drivers for inputting an output data of the write delay controller to the memory cell in response to a write enable signal; and a plurality of data buses commonly connected between the read latch and the read delay controller and between the write sense amplifier and the write delay controller, for transferring the data.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device for reducing a skew of a data line in accordance with the present invention will be described in detail referring to the accompanying drawings.

Figure 4:
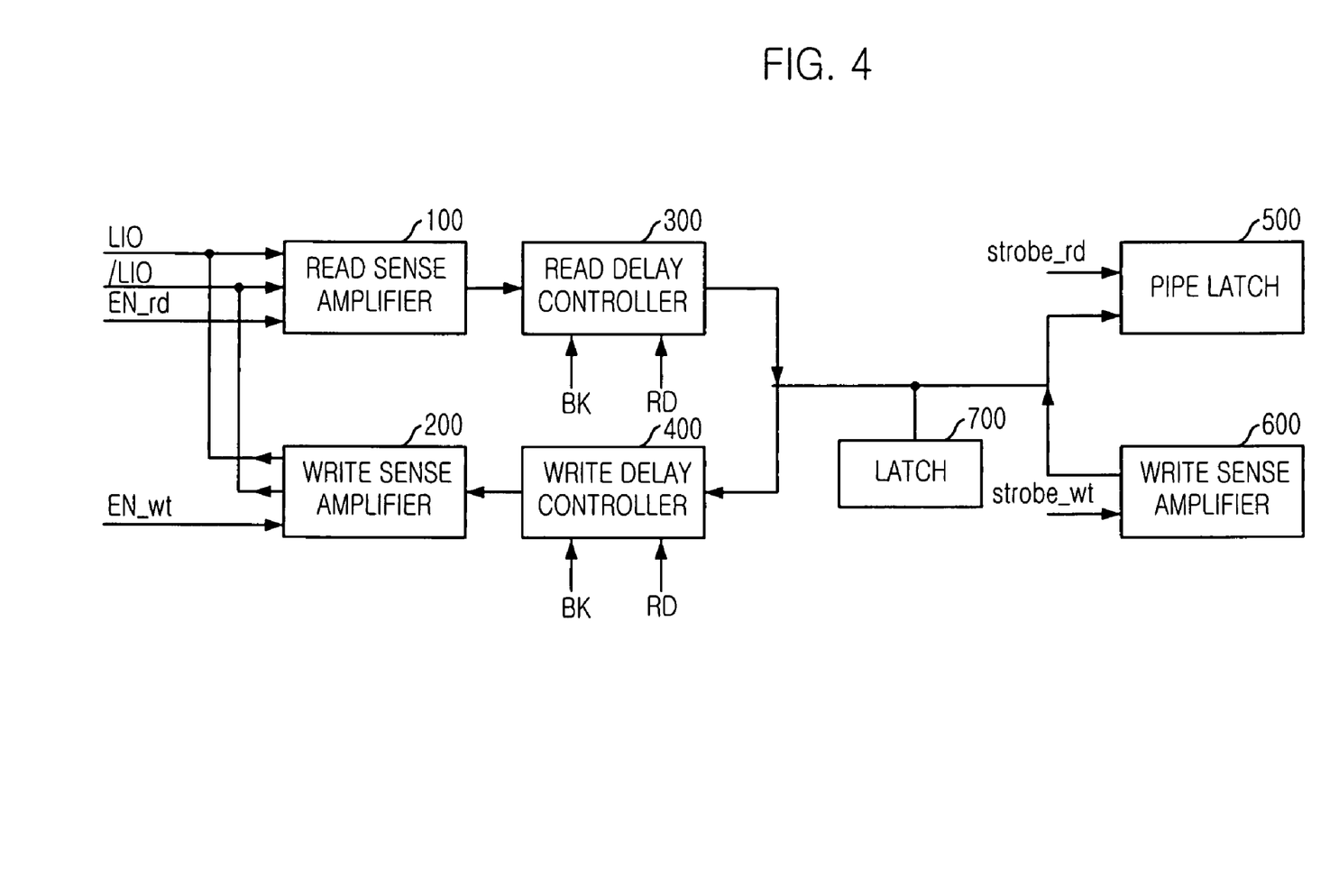
FIG. 4 is a block diagram of a semiconductor memory device in accordance with the present invention.

FIG. 4 is a block diagram of a semiconductor memory device in accordance with the present invention.

Referring to FIG. 4, the semiconductor memory device in accordance with the present invention includes a read sense amplifier 100, a read delay controller 300, a read latch (pipe latch) 500, a write sense amplifier 600, a write delay controller 400, a plurality of write drivers 200, and data bus GIO.

The read sense amplifier 100 senses and amplifies a data outputted from a memory cell, and the read delay controller 300 delays the output data of the read sense amplifier 100 by a predetermined time. The read latch 500 outputs an output data of the read delay controller 300 as an external data in response to a read strobe signal strobe_rd, and the write sense amplifier 600 senses and amplifies the external data in response to a write strobe signal strobe_wt. The write delay controller 400 delays an output data of the write sense amplifier 600 by a predetermined time, and the write drivers 200 input the output data of the write delay controller 400 to the memory cell in response to a write enable signal EN_wt. The data bus GIO is commonly connected between the read latch 500 and the read delay controller 300 and between the write sense amplifier 600 and the write delay controller 400.

Also, a latch 700 connected to the data bus GIO is further provided to temporarily store the transferring data.

Compared with the prior art, the read delay controller 300 and the write delay controller 400 are further included in the read sense amplifier 100 and the write driver 200, respectively. The read delay controller 300 and the write delay controller 400 delay a signal that arrives early due to the relatively short length of the data bus GIO. Consequently, an arrival time point of the early signal is equal to that of a late signal. In this manner, the setup time and the hold time can be secured.

Figure 5:
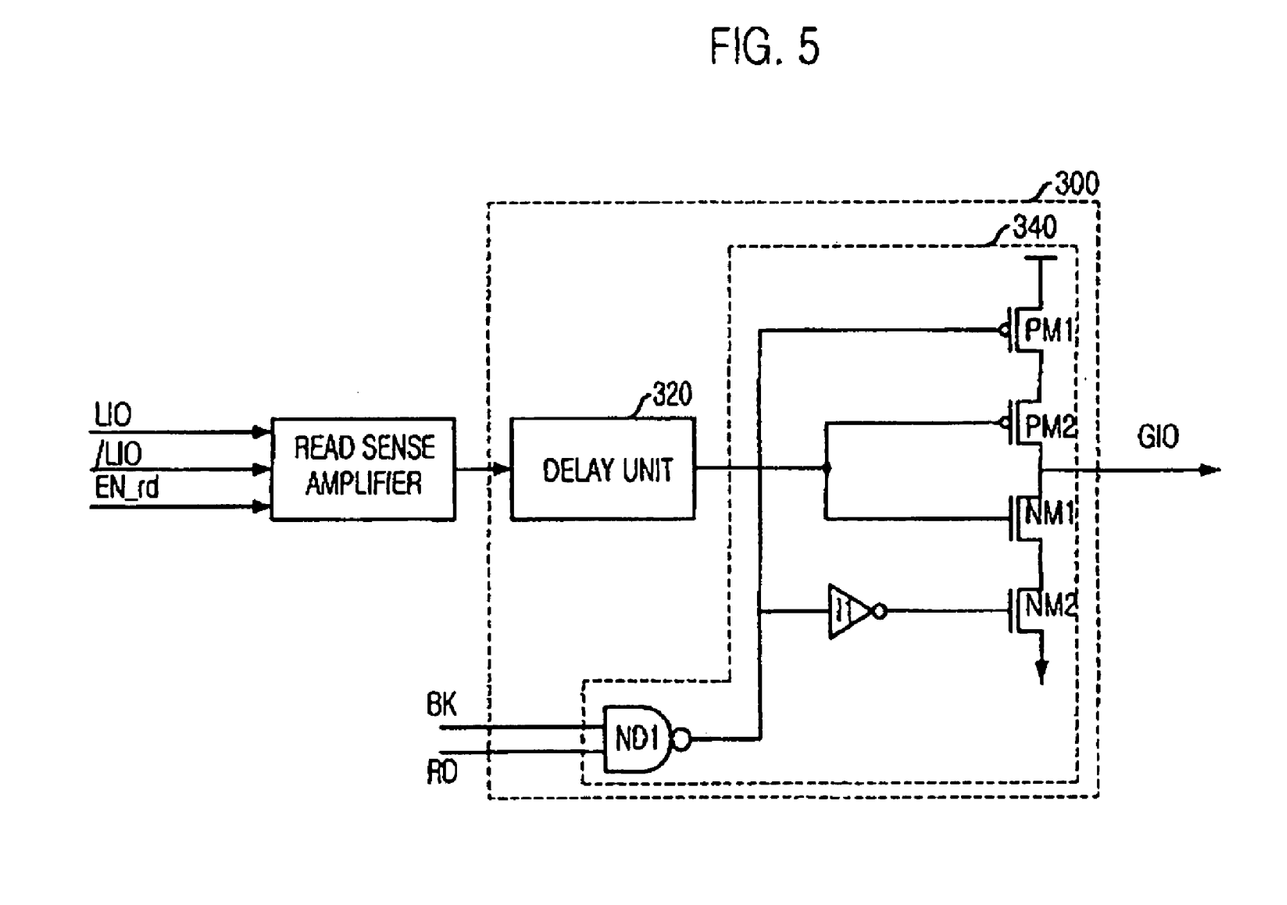
FIG. 5 is a circuit diagram of a read delay controller shown in FIG. 4.

FIG. 5 is a circuit diagram of the read delay controller shown in FIG. 4.

Referring to FIG. 5, the read delay controller 300 includes a delay unit 320 for delaying the output data of the read sense amplifier 100, and an output control unit 340 for outputting an output signal of the delay unit 320 in response to a bank signal BK an a read signal RD.

The output control unit 340 includes a NAND gate ND1 receiving the bank signal BK and the read signal RD, PMOS transistors PM1 and PM2 connected in series between a power supply terminal and an output node and respectively receiving an output signal of the NAND gate ND1 and an output signal of the delay unit 320, an inverter I1 for inverting an output signal of the NAND gate ND1, and NMOS transistors NM1 and NM2 connected in series between the output node and a ground terminal and respectively receiving an output signal of the delay unit 320 and an output signal of the inverter I1.

Since the read sense amplifier 100 outputs the data in response to the read enable signal EN_rd, the delay unit 320 is activated only when the data is outputted, thereby reducing the power consumption. Also, since the output control unit 340 is controlled by the bank signal BK and the read signal RD, the data applied on the data bus GIO in the write operation is applied to the delay unit, thereby reducing the power consumption.

Figure 6:
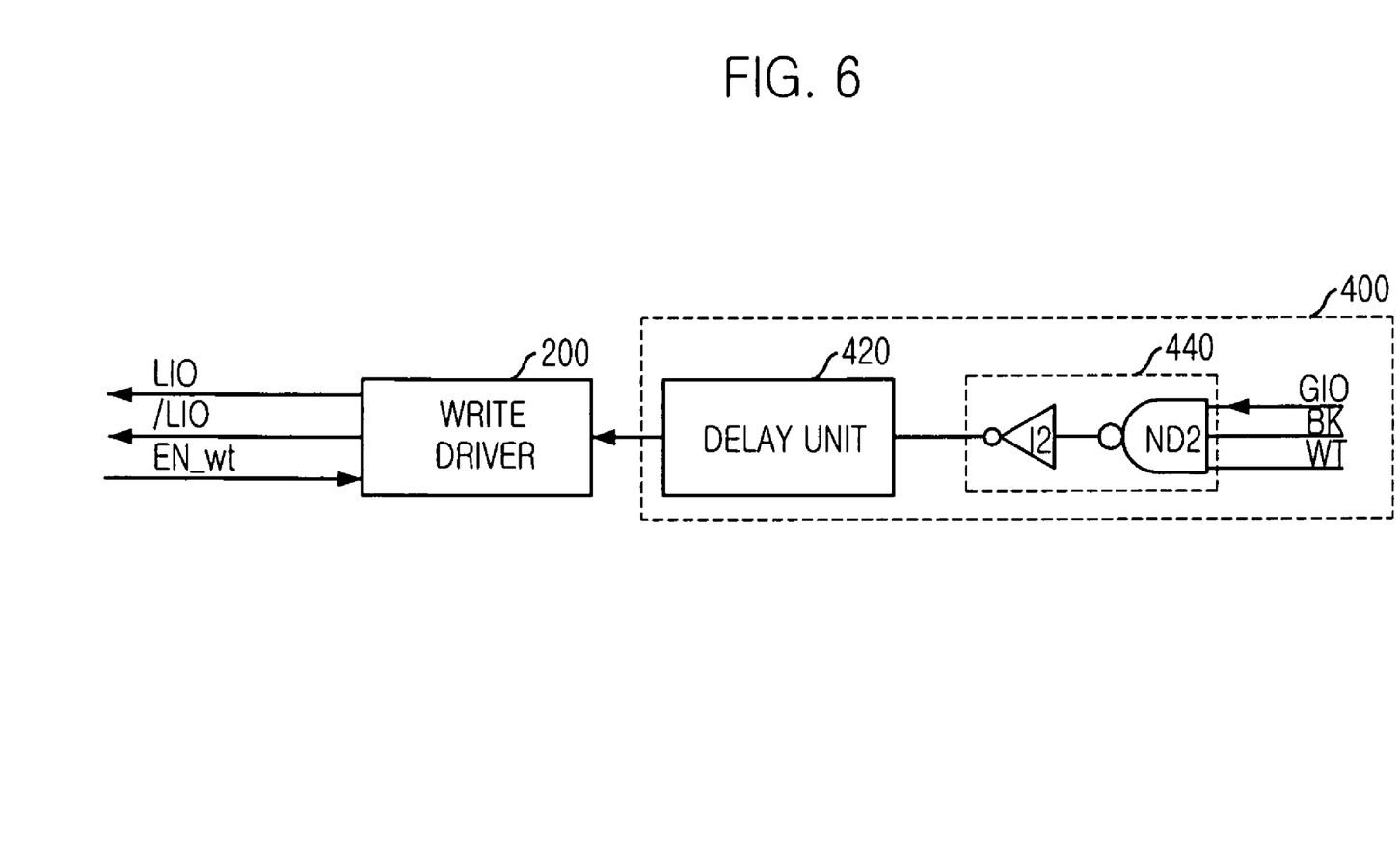
FIG. 6 is a circuit diagram of a write delay controller shown in FIG. 4.

FIG. 6 is a circuit diagram of the write delay controller shown in FIG. 4.

Referring to FIG. 6, the write delay controller 400 includes an input control unit 440 for transferring the data of the data bus GIO in response to the bank signal BK and the write signal WT, and a delay unit 420 for delaying an output data of the input control unit 440 by a predetermined time.

The input control unit 440 includes a NAND gate ND2 receiving the data of the data bus GIO, the bank signal BK and the write signal WT, and an inverter I2 for inverting an output signal of the NAND gate ND2.

Since the input control unit 440 transfers the data of the data bus GIO in response to the bank signal BK and the write signal WT, the power consumption due to the data applied on the data bus GIO in the read operation can be reduced.

Figure 7:
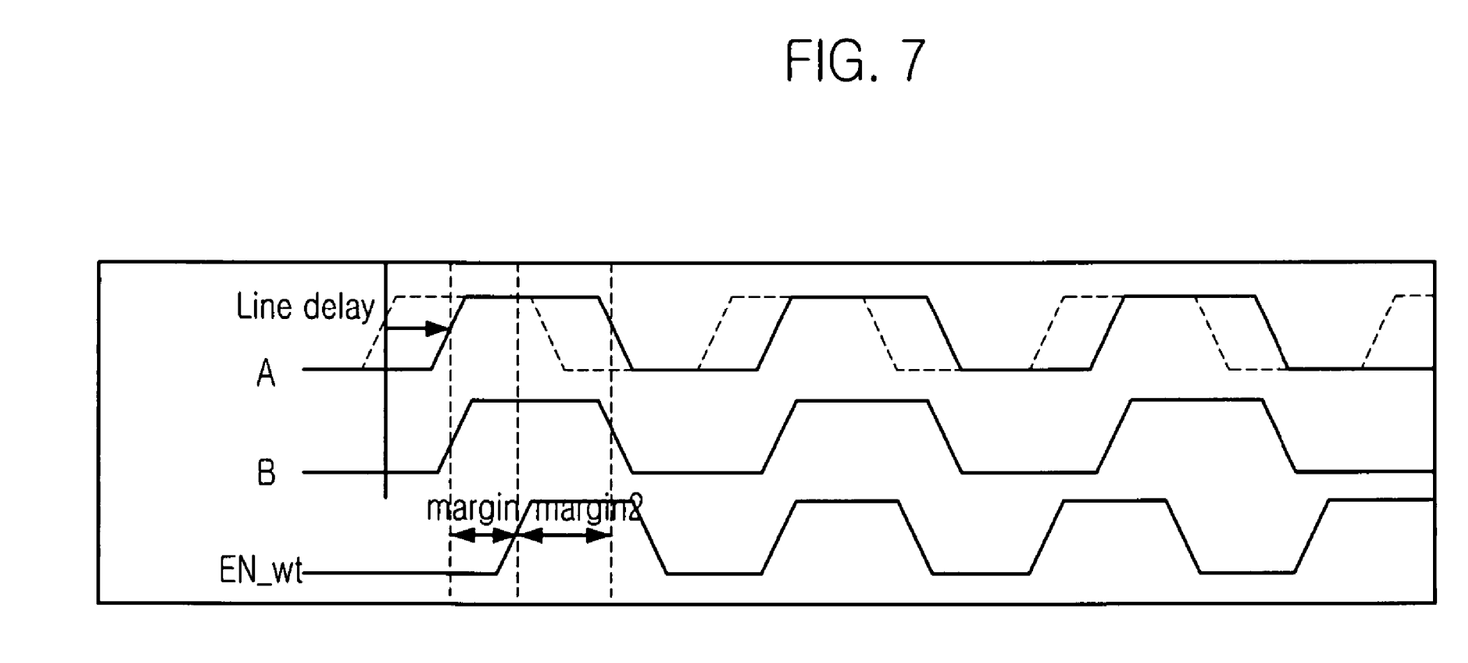
FIG. 7 is a waveform of the semiconductor memory device shown in FIG. 4.

FIG. 7 is a waveform of the semiconductor memory device shown in FIG. 4.

Unlike the semiconductor memory device of FIG. 3, the data A and B transferred through the data bus GIO arrive at the same time point. According to the present invention, the delay controllers 300 and 400 compensate for the length difference of the data buses GIO. Accordingly, it is possible to reduce the restriction of the setup time and the hold time of the write enable signal, which occur due to the signal skew according to the prior art.

Although the data bus GIO is shared in the read operation and the write operation, the present invention is not limited to that. Also, the present invention can be applied to a plurality of signal lines for transferring the same signal to a plurality of units, in addition to the data bus.

According to the present invention, the skew of the data line is reduced to thereby secure the setup time and hold time. Thus, the present invention can attribute to the high speed operating frequency of the semiconductor memory device.

The present application contains subject matter related to Korean patent application No. 2004-21516, filed in the Korean Patent Office on Mar. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having data lines, comprising:
   a multi-bit data line for transferring data signals in parallel; and
   at least one delay unit, each delay unit connected to one side of a data line having a short transfer time, for transferring a delayed data signal to the other side of the data line to thereby increase a transfer time of the corresponding data line,
   wherein each delay unit includes a control unit for controlling a delay amount of the delayed data signal in response to a read command or a write command.

2. The semiconductor memory device as recited in claim 1, further comprising a plurality of amplifiers, coupled to one, the other or both of each data line, for amplifying a data signal transferred through each data line.

3. The semiconductor memory device as recited in claim 1, wherein the multi-bit data line is used for transferring the data signals corresponding to the read command or the write command.

4. The semiconductor memory device as recited in claim 3, further comprising a latch for controlling an output timing if the data signals correspond to the read command.

5. The semiconductor memory device as recited in claim 1, wherein the control unit includes:
   a first NAND gate receiving the control signal;
   first and second PMOS transistors connected in series between a power supply terminal and an output node, the first and second PMOS transistors respectively receiving an output signal of the first NAND gate and an output signal of the delay unit;
   a first inverter for inverting the output signal of the first NAND gate; and
   first and second NMOS transistors connected in series between the output node and the ground terminal, the first and second NMOS transistors respectively receiving the output signal of the delay unit and an output signal of the first inverter.

6. The semiconductor memory device as recited in claim 1, wherein the control unit includes:
   a second NAND gate receiving data of the data bus and the control signal; and
   a second inverter for inverting an output signal of the second NAND gate.

7. A semiconductor memory device for reducing a skew of a data line, comprising:
   a plurality of read sense amplifiers for amplifying an output data of a memory cell;
   a plurality of read delay controllers for delaying an output data of the read sense amplifier by a predetermined time;
   a plurality of read latches for outputting an output data of the read delay controller as an external data in response to a read strobe signal;
   a plurality of write sense amplifiers for sensing and amplifying the external data in response to a write strobe signal;
   a plurality of write delay controllers for delaying an output data of the write sense amplifier by a predetermined time;
   a plurality of write drivers for inputting an output data of the write delay controller to the memory cell in response to a write enable signal; and
   a plurality of data buses commonly connected between the read latch and the read delay controller and between the Write sense amplifier and the write delay controller, for transferring the data.

8. The semiconductor memory device as recited in claim 7, wherein the read delay controller includes:
   a first delay unit for delaying the output data of the read sense amplifier; and
   an output control unit for outputting an output signal of the first delay unit in response to a first control signal.

9. The semiconductor memory device as recited in claim 8, wherein the write delay controller includes:
   an input control unit for transferring the data of the data bus in response to a second control signal; and
   a second delay unit for delaying an output data of the input control unit by a predetermined time.

10. The semiconductor memory device as recited in claim 9, wherein the output control unit includes:
    a first NAND gate receiving the first control signal;
    first and second PMOS transistors connected in series between a power supply terminal and an output node, the first and second PMOS transistors respectively receiving an output signal of the first NAND gate and the output signal of the first delay unit;
    a first inverter for inverting the output signal of the first NAND gate; and
    first and second NMOS transistors connected in series between the output node and a ground terminal, the first and second NMOS transistors respectively receiving the output signal of the first delay unit and an output signal of the first inverter.

11. The semiconductor memory device as recited in claim 10, wherein the input control unit includes:
    a second NAND gate receiving data of the data bus and the second control signal; and
    a second inverter for inverting an output signal of the second NAND gate.

12. The semiconductor memory device as recited in claim 7, wherein the write delay controller includes:
    an input control unit for transferring the data of the data bus in response to a second control signal; and
    a second delay unit for delaying an output data of the input control unit by a predetermined time.

13. The semiconductor memory device as recited in claim 12, wherein the output control unit includes:
    a first NAND gate receiving the first control signal;
    first and second PMOS transistors connected in series between a power supply terminal and an output node, the first and second PMOS transistors respectively receiving an output signal of the first NAND gate and the output signal of the first delay unit;
    a first inverter for inverting the output signal of the first NAND gate; and
    first and second NMOS transistors connected in series between the output node and a ground terminal, the first and second NMOS transistors respectively receiving the output signal of the first delay unit and an output signal of the first inverter.

14. The semiconductor memory device as recited in claim 13, wherein the input control unit includes:
    a second NAND gate receiving data of the data bus and the second control signal; and
    a second inverter for inverting an output signal of the second NAND gate.

15. A semiconductor memory device having data lines, comprising:
- a multi-bit data line for transferring data signals in parallel; and
- at least one delay unit, each delay unit connected to one side of a data line having a short transfer time, for transferring a delayed data signal to the other side of the data line to thereby increase a transfer time of the corresponding data line,
- wherein each delay unit includes a control unit for controlling a delay amount of the delayed data signal in response to a control signal, wherein the control unit includes a first NAND gate receiving the control signal, first and second PMOS transistors connected in series between a power supply terminal and an output node, the first and second PMOS transistors respectively receiving an output signal of the first NAND gate and an output signal of the delay unit, a first inverter for inverting the output signal of the first NAND gate, and first and second NMOS transistors connected in series between the output node and the ground terminal, the first and second NMOS transistors respectively receiving the output signal of the delay unit and an output signal of the first inverter.

16. The semiconductor memory device as recited in claim 15, wherein the control unit includes:
- a second NAND gate receiving data of the data bus and the control signal; and a second inverter for inverting an output signal of the second NAND gate.

* * * * *